(12) United States Patent
Freimuth et al.

(10) Patent No.: US 7,559,807 B2
(45) Date of Patent: Jul. 14, 2009

(54) MODULAR WIRING DEVICE

(75) Inventors: Michael Freimuth, Hirschau (DE);
Fritz Royer, Hahnbach (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/542,027

(22) PCT Filed: Nov. 7, 2003

(86) PCT No.: PCT/DE03/03694

§ 371 (c)(1),
(2), (4) Date: Jan. 17, 2006

(87) PCT Pub. No.: WO2004/068662

PCT Pub. Date: Aug. 12, 2004

(65) Prior Publication Data

US 2006/0134956 A1 Jun. 22, 2006

(30) Foreign Application Priority Data

Jan. 13, 2003 (DE) ................. 103 01 004

(51) Int. Cl.
*H01R 9/22* (2006.01)
(52) U.S. Cl. ...................................... 439/717
(58) Field of Classification Search ................. 439/717, 439/76.1, 716, 712–713, 715; 361/735, 732–733, 361/744, 785
See application file for complete search history.

(56) References Cited

U.S. PATENT DOCUMENTS

| 5,168,137 | A | | 12/1992 | Hufnagel et al. |
| 5,629,831 | A | * | 5/1997 | Eggert et al. ................. 361/624 |
| 5,641,313 | A | | 6/1997 | Hohorst |
| 5,655,922 | A | | 8/1997 | Dux et al. |
| 5,984,734 | A | * | 11/1999 | Piper et al. ................... 439/717 |
| 6,081,048 | A | * | 6/2000 | Bergmann et al. .......... 307/147 |
| 6,231,400 | B1 | * | 5/2001 | Nagai .......................... 439/701 |
| 6,332,812 | B1 | * | 12/2001 | Kazuhara .................... 439/701 |
| 6,961,233 | B2 | * | 11/2005 | Hoeing et al. ............... 361/622 |

FOREIGN PATENT DOCUMENTS

DE 90 00 398 U1 5/1990

(Continued)

OTHER PUBLICATIONS

Produktkatalog der Firma Phoenix mit der Bezeichnung "Lelterplattenanschluss COMBICON" 2002, Selten 3, 318.

(Continued)

*Primary Examiner*—Jean F Duverne
(74) *Attorney, Agent, or Firm*—Harness, Dickey & Pierce, P.L.C.

(57) ABSTRACT

Disclosed is a wiring device that can be equipped with at least one connection module and is provided with a contacting device(s). In order to protect the optionally live contacting device(s) of the wiring device with simple device(s) against accidental contact when contacting the connection module that can be coupled, an insulating device(s) is disposed at the end of and/or along the contacting device(s).

16 Claims, 1 Drawing Sheet

FOREIGN PATENT DOCUMENTS

| | | | |
|---|---|---|---|
| DE | 94 20 189 | U1 | 6/1995 |
| DE | 44 02 001 | A1 | 7/1995 |
| DE | 296 06 735 | U1 | 8/1996 |
| DE | 296 06 759 | U1 | 8/1996 |
| EP | 0 639 877 | A | 8/1994 |
| EP | 1 058 348 | A | 12/2000 |

OTHER PUBLICATIONS

International Search Report PCT/ISA/210 (German & English).
International Preliminary Examination Report PCT/IPEA/416; PCT/IPEA/409 (5 pages total).
German Office Action Issued Sep. 24, 2003.
German Translation Aid (3 pages).

* cited by examiner

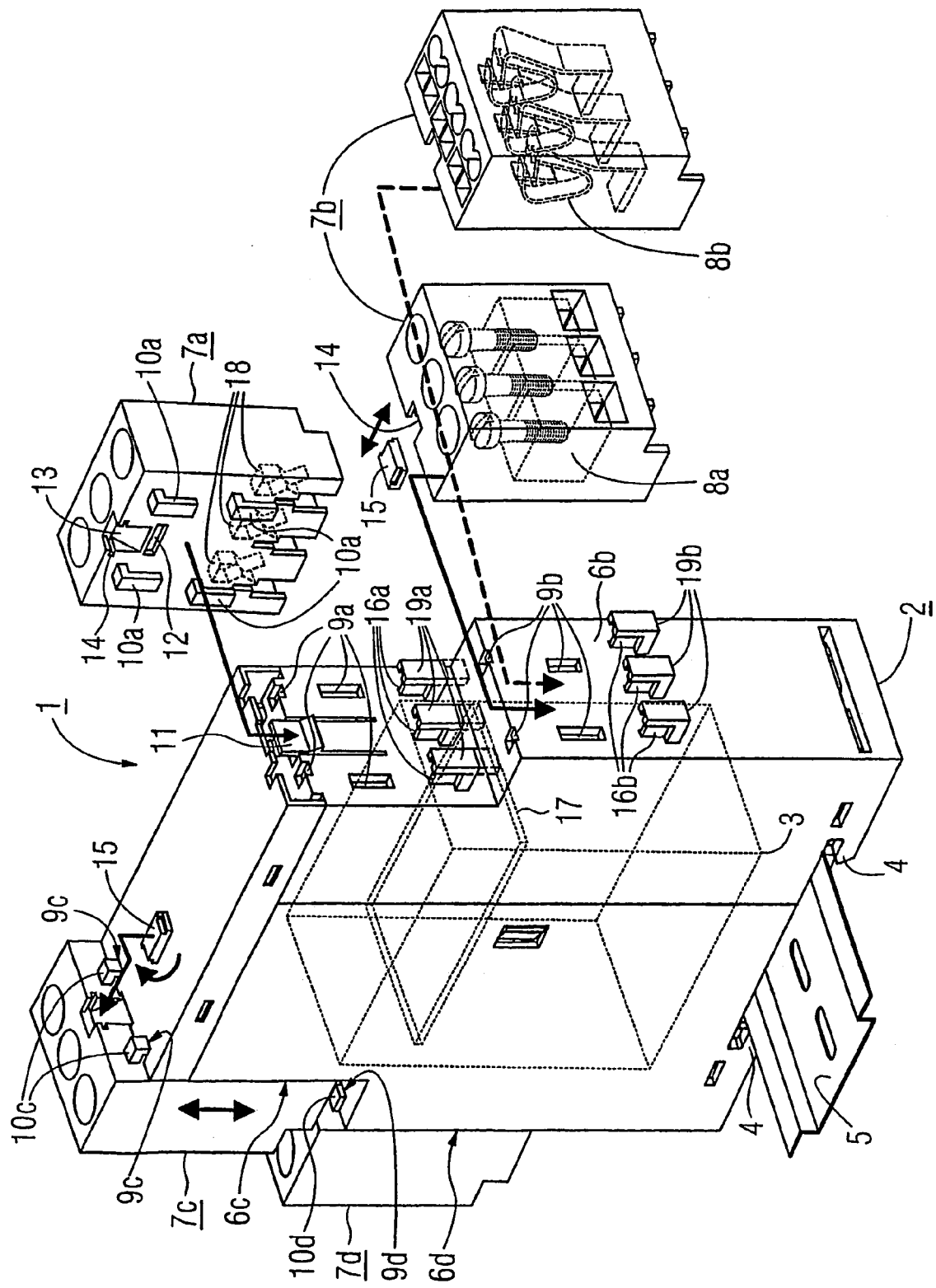

MODULAR WIRING DEVICE

This application is the national phase under 35 U.S.C. § 371 of PCT International Application No. PCT/DE2003/003694 which has an International filing date of Nov. 7, 2003, which designated the United States of America and which claims priority on German Patent Application number DE 103 01 004.1 filed Jan. 13, 2003, the entire contents of which are hereby incorporated herein by reference.

FIELD

The invention generally relates to a modular service device.

BACKGROUND

The Phoenix product catalog entitled "Leiterplattenanschluss COMBICON 2002" [COMBICON 2002 printed circuit board connection] discloses, for example on pages 3 and 318, a modular installation device which is provided with a housing and a top-hat rail holder and has removable screw terminal blocks which are provided with block-standardized coding for the purpose of supplying the blocks in the correct position, claw-like projections for the purpose of fixing them to the housing and contact needles with which contact is to be made axially. Such an installation device is used, for example, as a rail-mounted device in a switchgear cabinet and acts as a switching and/or protective switching device, signal converter or the like for the purpose of converting switching and/or control concepts.

SUMMARY

An embodiment of the invention includes an object of specifying a service device which can be equipped with connection modules and has at least one contact device, and in the case of which the possibly voltage-carrying contact device(s) for the purpose of making contact with the associated connection modules is protected against unintentional touching contact using simple device(s)/method(s).

The use of an insulating device(s) which is arranged on the end and/or longitudinal side on the respective contact device(s) also ensures, using simple device(s)/method(s), protection against touching contact in accordance with regulations. This is true, in particular, at the locations for modules on the service device, with regard to the exposed and possibly voltage-carrying contact device(s), even when the connection module has been removed.

The insulating device(s) is/are advantageously arranged such that the corresponding contact device(s) is/are covered on the end and/or longitudinal side, as a result of which the exposed surfaces of the contact device(s) can be reduced.

The respective insulating device(s) may also be in the form of an insulating bracket, in particular in the form of a plug-in element which can be integrated in the housing. By way of such a device(s), the contact device(s) to be covered in order to protect against touching contact can be made safe in a simple manner.

BRIEF DESCRIPTION OF THE DRAWINGS

The invention and advantageous refinements in accordance with the features of the further claims will be explained in more detail below with reference to example embodiments illustrated in the drawings, in which the FIGURE shows a perspective illustration of a service device having arranged connection modules and further connection modules which can be arranged.

The FIGURE shows an example of a modular service device.

DETAILED DESCRIPTION OF THE EXAMPLE EMBODIMENTS

The FIGURE shows a modular service device 1 having a housing 2 which advantageously has a schematically illustrated electrical, electromagnetic or electronic device unit 3. The intended use of the service device 1 can be determined by the replaceable device unit 3. The service device 1 has a retaining device 4 which is integrated in the housing 2 and is provided for a bearing device 5, in particular a top-hat rail, which can be coupled to said retaining device 4. The bearing device 5 is mounted, for example, in a distribution board, switchgear cabinet or the like, with the result that the service device 1 which has been snapped onto it has a fixed installation position.

The service device 1 or the housing 2 is also provided with two or more module locations 6a-6d, a first and a second module location 6a and 6b being provided on an end side of the housing 2 for a first and second connection module 7a and 7b, respectively, which can be arranged at said module locations 6a and 6b. A third and a fourth module location 6c and 6d, which are arranged on another end side, are each fitted with an associated third and fourth connection module 7c and 7d, respectively. It is therefore not necessary to completely replace a device in the event of a defect in or maintenance work on a wired device. Such a complete replacement would also require all of the connection devices or all of the lines to be detached.

In a manner representative of the other connection modules 7b-7d, the connection module 7b is advantageously provided in each case with a multi-pole connection device. Two embodiments of the connection module 7b show firstly a simplified illustration of the screw terminal 8a and secondly a simplified illustration of the spring-loaded terminal 8b as the connection device. Of course other embodiments, such as an insulation displacement contact or the like, can be used. The connection devices are each determined for a single- or multi-core line (not illustrated here) which can be connected thereto.

A first and a second coding device 9a and 9b are provided on a housing wall at the first and the second module locations 6a and 6b, respectively. The two coding devices 9a and 9b each correspond to an associated first opposing coding device 10a and to a second opposing contact device (not illustrated here), respectively. The first opposing contact device 10a and the second opposing contact means are part of a first and a second connection module 7a and 7b, respectively. Both the contact device 9a, 9b and the first opposing contact device 10a and the second opposing contact device serve the purpose of providing module location-specific assignment, i.e. assignment which cannot become confused, of the first and second connection module 7a and 7b, respectively, on the housing 2.

The same applies to the third and fourth module locations 6c and 6d which are each provided with a third and a fourth coding device 9c and 9d, respectively. The third and fourth coding devices 9c and 9d are each compatible with an associated third and fourth opposing coding devices 10c and 10d, respectively, of the third and fourth connection modules 7c and 7d, respectively, which can be arranged. The coding devices 9a-9d at the module locations 6a-6d of the housing 2 and the opposing coding devices 10a-10d on the connection modules 7a-7d are therefore coded overall with respect to one another in a simple manner. This applies both to connection modules on one connection side and to connection modules on different connection sides, with the result that an assignment error and therefore, under certain circumstances, destruction of a device can be avoided.

In this case, by way of example, the first coding device 9a of the first module location 6a is formed by four recesses in the housing wall which are formed by housing sections. The recesses or else apertures are different in terms of their locations, positions and/or dimensions than those of the second coding device 9b for individualization purposes. The first opposing coding device 10a is in this exemplary embodiment in the form of a bracket element and is designed in terms of its location, position and/or dimensions so as to correspond to the recesses in the first coding means 9a, with the result that it is not possible for it to be confused with, for example, the second or third connection module 7b or 7c.

The bracket elements advantageously act at the same time as fixing hooks for the connection modules 7a-7d on the housing 2 of the service device 1. The same naturally also applies to all other module locations 6b-6d and connection modules 7b-7d, an individual design for the respective coding devices 9b-9d and the corresponding second or third and fourth opposing coding devices 10c and 10d being provided per module location 6b-6d. In a further refinement, the coding devices 9a-9d can also be provided on the respective connection modules 7a-7d, the opposing coding devices 10a-10d being arranged on the housing 2 with a suitable alignment.

The first module location 6a also has, on the end side, a latching device 11 in the housing wall of the housing 2. The third module location 6c is likewise equipped with such a latching device (not illustrated here). An opposing latching device 12, which, in interaction with the latching device 11, serves the purpose of providing module location-specific locking and unlocking of the first connection module 7a in the sense of a locking mechanism, is provided on the first connection module 7a. Unintentional release of the first connection module 7a is thus ruled out. Even in the event of tensile forces occurring, which may be introduced via a connected line, release of the connection modules is ruled out. This is of significance insofar as release under load conditions may lead to contact erosion and to overheating and, in the most unfavorable case, to destruction of the device owing to a resultant arc formation. The same similarly applies to the third connection module 7c, the latching device 11 latching with the opposing latching device 12 once the connection modules 7a-7d have been pushed on. The latching device 11 is in the form of an elastic latch having a barb. The lock for its part comprises integral or multi-part, resilient elements.

The latching device 11 is advantageously part of the housing wall, as a result of which a simple embodiment which has reduced manufacturing complexity is provided. The opposing latching device 12 is also advantageously of simple design, namely in the form of a latch accommodating the barb. In the context of at least one embodiment of the invention, the lock can also be integrated in one of the connection modules 7a-7d or the latch can be integrated in the housing 2 of the service device 1. The latch which is in the form of a recess in a wall of the first connection module 7a is arranged at one end of a ramp 13, by which the lock can be released, for example by way of a screwdriver.

A slot-shaped receptacle 14 for a closure element 15 which can be inserted therein is provided at another end of the ramp 13. The closure element 15 in the inserted state blocks the access to the lock and thus prevents unlocking of the locking mechanism, with the result that undesired disassembly or removal of the first connection module 7a can be prevented. Owing to the physical overlapping of the first connection module 7a with respect to the second connection module 7b in the state in which it is mounted on the service device 1, a separate locking mechanism for the second connection module 7b is superfluous, since it can be removed only once the first connection module 7a has been released.

A first contact device 16a is arranged on one end side, in particular at the first module location 6a, of the housing 2. A second contact device 16b is provided, analogously to the first module location 6a, at the second module location 6b which is set back in the form of a step. The contact devices 16a, 16b which protrude on the end side are part of a so-called contact carrier (not shown here). The contact carrier is placed and fixed on a printed circuit board 17 of the device unit 3. The contact carrier acts, inter alia, as an electrically conductive connection between the contact devices 16a, 16b and the printed circuit board 17. The first connection module 7a which is associated with the first contact device 16a is provided with an opposing contact device 18 (illustrated in simplified form) which is arranged within the first connection module 7a behind a cutout in the associated module housing.

The first contact device 16a forms, together with the opposing contact device 18, a connection interface between the service device 1 and the first connection module 7a. The first contact device 16a has a longitudinal side which is aligned with an upper side of the service device 1. When the first connection module 7a is fed to the first module location 6a of the service device 1 in the direction of the first contact device 16a and along one end side, the first contact device 16a can make contact with the opposing contact device 18 transversely with respect to the longitudinal side of said first contact device 16a, which results in a perpendicular contact-making direction or vertical coupling and decoupling direction. In contrast to an installation device having a horizontal coupling and decoupling direction with respect to the connection modules, disassembly of the connection modules 7a-7d is also ensured with the present service device 1 in the case of a small spacing between the rows, for example in the switchgear cabinet.

The first contact device 16a is advantageously in the form of a group of flat contact elements, in particular in the form of contact tongues or contact lugs or in the form of contact pins. The flat contact elements are arranged with their flat side parallel to side faces of the housing 2, their number being freely selectable. In order to maintain the compatibility, the opposing contact device 18 is advantageously in the form of a group of fork-shaped contact elements, as a result of which a simple electrically conductive contact connection which favors contact is provided. The opposing contact device 18 is representative of all other opposing contact means of the further connection modules 7b-7d. In this case, a releasable connection to the flat contact elements is provided by way of the fork-shaped contact elements (also referred to as spring contacts or tulip contacts). Similarly, these physical designs are also reproduced at the other module locations 6b-6d or on the other connection modules 7b-7d.

Stamped, bent parts (not shown here), which provide an electrically conductive connection on the one hand to the respective connection device(s) and on the other hand to the corresponding opposing contact device(s), are integrated, inter alia, in the individual connection modules 7a-7d. An embodiment of the service device 1 can also be realized with fork-shaped contact elements, in the case of which the flat contact elements are part of a connection module.

A first and a second insulating devices 19a and 19b are arranged in the form of a touching contact protection device on the end and longitudinal side on the first and the second contact devices 16a and 16b, for example. The respective insulating devices 19a and 19b, in the form of a group of insulating elements, covers the associated contact devices 16a and 16b, respectively, with the result that touching contact with the possibly voltage-carrying contact devices 16a and 16b, respectively, once the connection modules 7a and 7b, respectively, have been withdrawn is advantageously ruled out.

The insulating devices 19a, 19b, which in the present example are in the form of insulating brackets or insulating projections illustrated by dashed lines, ensure that the requirements of relevant standards are adhered to, for example those of EN 61140 "Schutz gegen elektrischen Schlag" [Protection against electric shock]. In one advantageous development, the insulating devices 19a, 19b, which are also referred to as finger touch-safe tabs, may also be in the form of plug-in elements which can be integrated in the housing 2. When the housing 2 is appropriately designed with corresponding receptacles, modification of such insulating device(s) can easily be carried out.

The insulating devices 19a, 19b are also arranged parallel or perpendicular to the longitudinal side of the corresponding contact devices 16a, 16b, as a result of which effective protection against touching contact is provided with little complexity and use of materials. Furthermore, the housing 2 with the insulating devices 19a, 19b is in the form of an integral composite, i.e. in the form of a composite with a reduced number of parts. In this case, the composite can be matched to the device-specific requirements by way of a predefinable injection mold. In the context of an embodiment the invention, the insulating devices 19a, 19b can also similarly be provided, in particular in an embodiment with flat contact elements, on the connection modules 7a-7d.

The feed direction of the connection modules 7a-7d, which is predetermined on the basis of the contact-making direction, in accordance with the assembly sequence illustrated by way of feed arrows results in the design for the coding and opposing coding means 9a-9d and 10a-10d, the latching and opposing latching devices 11 and 12 and the insulating device(s) 19. The coding and opposing coding devices 9a-9d and 10a-10d, the latching and opposing latching devices 11 and 12 and the insulating device(s) 19 can likewise be realized by embodiments which have the same effect but are different than the previously mentioned devices as regards the advantageous example embodiments described.

Coupling and decoupling of the first connection module 7a to the service device 1 takes place, in a manner representative of the further connection modules 7b-7d, essentially perpendicular to the longitudinal axis of the first contact device 16a. Coupling of the respective connection modules 7a-7d to the module locations 6a-6d results in an arrangement which brings about electrical contact-making and a mechanical connection including coding and locking in the sense of an operative connection. This results in comfortable access even in the case of a narrow arrangement of the service device 1, for example between wiring channels in a switchgear cabinet.

As long as one or more of the connection modules 7a-7d are intended to be removed for repair or modification purposes, first unlocking of the locking mechanism takes place via a tool. In this case, the barb of the lock is pressed out of the latch, and the corresponding connection module can be removed. On reassembly, a clear assignment of all of the released connection modules to the corresponding module location is ensured on the basis of the coding and opposing coding devices 9a-9d and 10a-10d.

The embodiments of the invention explained above can be summarized as follows: in order to specify a service device 1, which can be equipped with at least one connection module 7a-7d and has a contact devices 16a, 16b, and in the case of which the possibly voltage-carrying contact devices 16a-16b for the purpose of making contact with the connection module 7a-7d which can be coupled and decoupled is intended to be protected against unintentional touching contact using simple devices/methods, provision is made for an insulating devices 19a, 19b to be arranged on the end and/or longitudinal side of the contact devices 16a, 16b.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

The invention claimed is:

1. A modular service device, comprising:
a housing enclosing an electrical component, the housing including at least one module location on an exterior surface of the housing;
at least one connection module, arrangeable at the module location and including a connection device configured to connect a connectable line;
contact means arranged at the module location and at least one opposing contact arranged on the connection module, for contacting the at least one opposing contact;
insulating means, arranged at least at one of an end and a longitudinal side on at least one of the contact means and the opposing contact, for covering the contact means on at least one of the end and the longitudinal side; and
a spring-loaded retaining means for coupling to a bearing device.

2. The modular service device as claimed in claim 1, wherein the insulating means includes an insulating bracket.

3. The modular service device as claimed in claim 1, wherein the insulating means is a plug-in element on the housing.

4. The modular service device as claimed in claim 1, wherein the insulating means is arranged at least at one of parallel and perpendicular to the longitudinal side of the contact means.

5. The modular service device as claimed in claim 1, wherein the housing and the insulating means are in the form of an integral composite.

6. The modular service device as claimed in claim 1, wherein the contact means include a longitudinal side, the contact means being contactable with the at least one opposing contact transversely with respect to the longitudinal side.

7. The modular service device as claimed in claim 1, further comprising latching means per module location and opposing latching means per connection module, for respectively providing module location-specific locking and unlocking.

8. The modular service device as claimed in claim 1, further comprising at least one of an electrical, electromagnetic and electronic device unit.

9. The modular service device as claimed in claim 1, wherein the insulating means covers the end and the longitudinal side of the contact means.

10. A modular service device, comprising:
a housing enclosing an electrical component, the housing including at least one module location on an exterior surface of the housing;
at least one connection module, arrangeable at the module location and including a connection device configured to connect a connectable line;
a contact device at the module location and an opposing contact device at the connection module, the contact device being contactable with the opposing contact device;
an insulating device, arranged at least at one of on an end and a longitudinal side on at least one of the contact device and the opposing contact device, the contact device being covered on at least one of the end and the longitudinal side by the insulating device; and
a spring-loaded retaining device, coupleable to a bearing device.

11. The modular service device as claimed in claim 10, wherein the insulating device includes an insulating bracket.

12. The modular service device as claimed in claim 10, wherein the insulating device is integrated as a plug-in element on the housing.

13. The modular service device as claimed in claim 10, wherein the insulating device is arranged at least at one of parallel to and perpendicular to the longitudinal side of the contact device.

14. The modular service device as claimed in claim 10, wherein the housing and the insulating device are in the form of an integral composite.

15. The modular service device as claimed in claim 10, wherein the contact device include a longitudinal side, the contact device being contactable with the opposing contact device transversely with respect to the longitudinal side.

16. The modular service device as claimed in claim 10, wherein insulating device covers the end and the longitudinal side of the contact device.

* * * * *